United States Patent
Nakada et al.

(10) Patent No.: US 10,550,468 B2
(45) Date of Patent: Feb. 4, 2020

(54) SUBSTRATE PROCESSING APPARATUS

(71) Applicant: HITACHI KOKUSAI ELECTRIC INC., Tokyo (JP)

(72) Inventors: Takayuki Nakada, Toyama (JP); Tomoshi Taniyama, Toyama (JP); Kenji Shirako, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 266 days.

(21) Appl. No.: 15/422,018

(22) Filed: Feb. 1, 2017

(65) Prior Publication Data

US 2017/0218513 A1    Aug. 3, 2017

(30) Foreign Application Priority Data

Feb. 2, 2016    (JP) ................. 2016-017990

(51) Int. Cl.
*H01L 21/02*     (2006.01)
*H01L 21/67*     (2006.01)
(Continued)

(52) U.S. Cl.
CPC .......... *C23C 16/455* (2013.01); *C23C 16/402* (2013.01); *C23C 16/4401* (2013.01);
(Continued)

(58) Field of Classification Search
None
See application file for complete search history.

(56) References Cited

U.S. PATENT DOCUMENTS 5,261,167 A * 11/1993 Sakata ................. F26B 21/003
                                                                34/77
5,551,984 A *  9/1996 Tanahashi .......... C23C 16/4401
                                                               118/715
(Continued)

FOREIGN PATENT DOCUMENTS

JP    2002-175999 A    6/2002
JP    2002-176045 A    6/2002
(Continued)

OTHER PUBLICATIONS

Korean Office Action dated Nov. 30, 2018 for the Korean Patent Application No. 10-2018-0146431.
(Continued)

*Primary Examiner* — Karla A Moore
(74) *Attorney, Agent, or Firm* — Volpe and Koenig, P.C.

(57) ABSTRACT

A substrate processing apparatus includes a transfer chamber; an upper gas supply mechanism for supplying a gas into an upper region of the transfer chamber through a first gas supply port; and a lower gas supply mechanism configured to supply the gas into a lower region of the transfer chamber through a second gas supply port. The upper gas supply mechanism includes a first buffer chamber at a back surface of the first gas supply port; a pair of upper ducts at both sides of the first buffer chamber; and a first ventilation unit at lower ends of the pair of upper ducts. The lower gas supply mechanism includes a second buffer chamber at a back surface of the second gas supply port; a lower duct at lower surface of the second buffer chamber; and a second ventilation unit at a lower end of the lower duct.

12 Claims, 11 Drawing Sheets

(51) Int. Cl.
  *H01L 21/673* (2006.01)
  *C23C 16/455* (2006.01)
  *C23C 16/40* (2006.01)
  *C23C 16/44* (2006.01)

(52) U.S. Cl.
  CPC .. *H01L 21/02164* (2013.01); *H01L 21/02271* (2013.01); *H01L 21/67201* (2013.01); *H01L 21/67303* (2013.01)

(56) References Cited

U.S. PATENT DOCUMENTS

| | | | | |
|---|---|---|---|---|
| 2002/0023458 | A1* | 2/2002 | Sakata | F27B 5/04 62/378 |
| 2008/0105204 | A1* | 5/2008 | Nakada | H01L 21/67109 118/728 |
| 2010/0229416 | A1* | 9/2010 | Aburatani | H01L 21/67109 34/194 |
| 2011/0239937 | A1 | 10/2011 | Ahn et al. | |
| 2011/0305543 | A1* | 12/2011 | Nakashima | H01L 21/67017 414/217.1 |
| 2012/0270170 | A1* | 10/2012 | Nitadori | H01L 21/67017 432/77 |
| 2019/0019705 | A1 | 1/2019 | Nakada et al. | |

FOREIGN PATENT DOCUMENTS

| | | |
|---|---|---|
| JP | 2007-116089 A | 5/2007 |
| JP | 2008-172080 A | 7/2008 |
| JP | 2013-026509 A | 2/2013 |
| KR | 10-2012-0034551 A | 4/2012 |
| WO | 2016/117588 A1 | 1/2016 |

OTHER PUBLICATIONS

Chinese Office Action dated Jul. 19, 2019 for the Chinese Patent Application No. 201710059927.6.
Japanese Office Action dated Sep. 3, 2019 for the Japanese Patent Application No. 2018-217930.

* cited by examiner

FIG. 4A
FIG. 4B
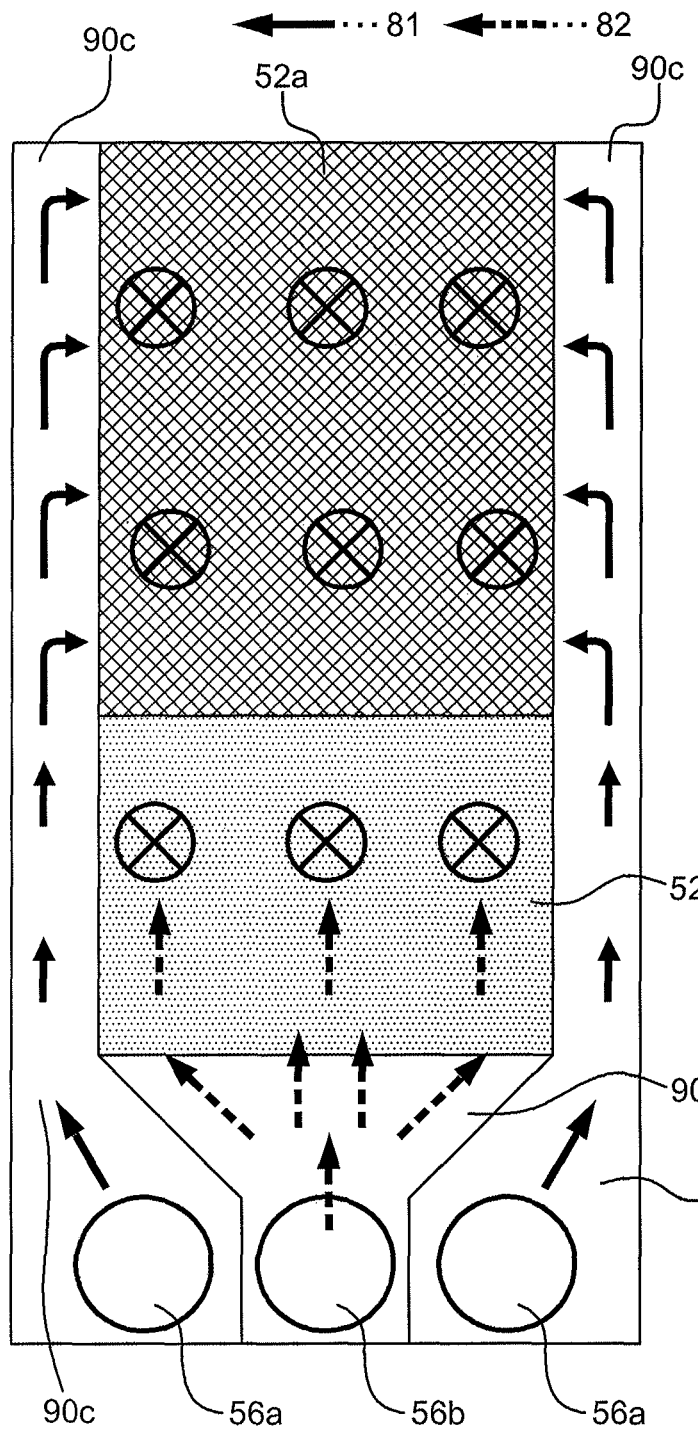
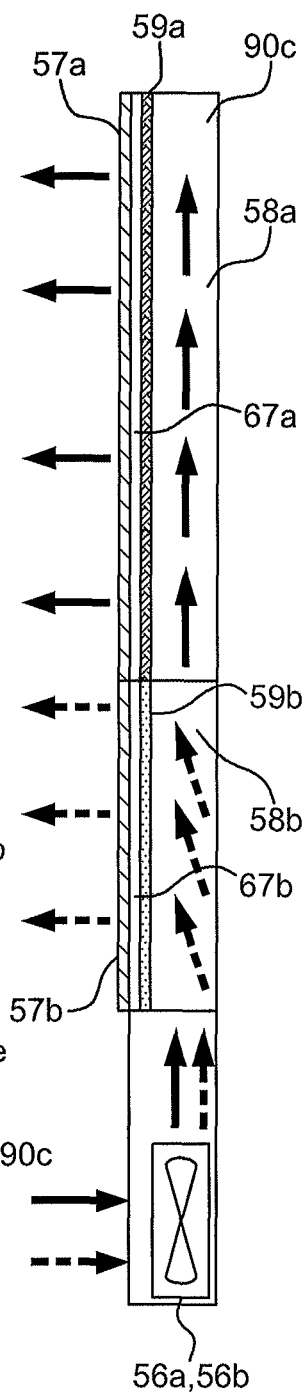

FIG. 8A
FIG. 8B
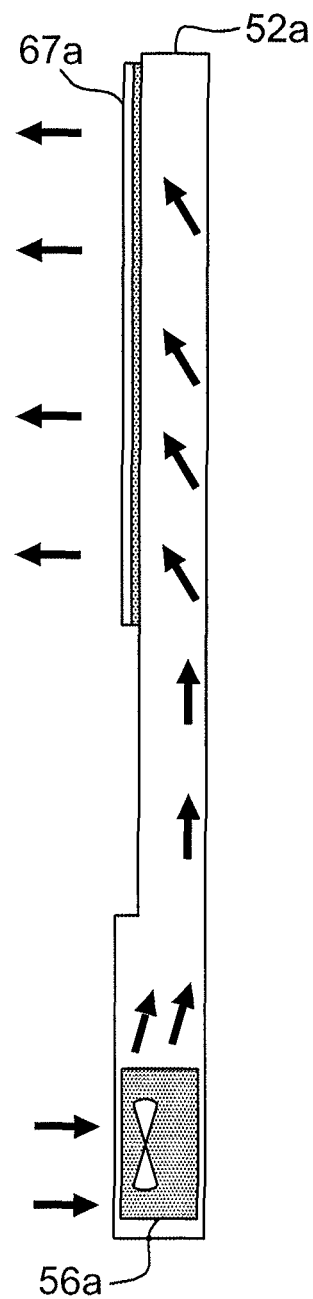
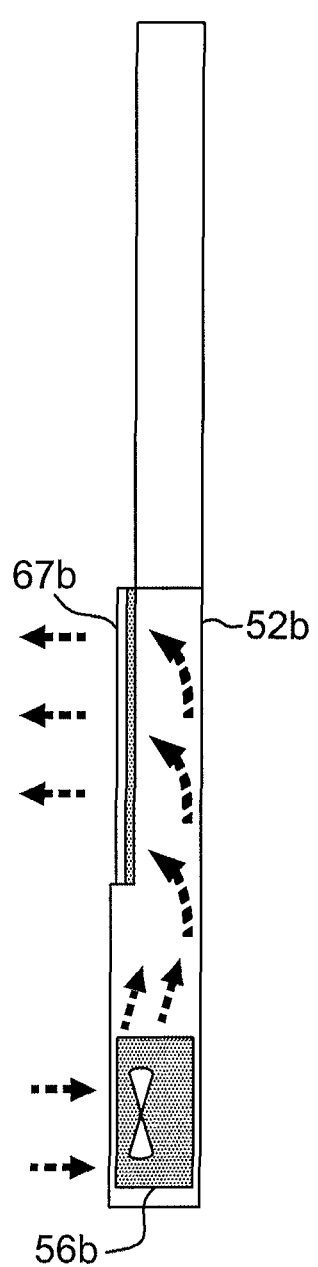

SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2016-017990, filed on Feb. 2, 2016, the entire contents of which are hereby incorporated by reference.

BACKGROUND

1. Field

The present disclosure relates to a substrate processing apparatus.

2. Description of the Related Art

Generally, a vertical type substrate processing apparatus used in a semiconductor device manufacturing process includes a transfer chamber where a wafer is loaded into or unloaded from a substrate retainer. The transfer chamber is installed under a process chamber where the wafer is processed. A cleaning unit is installed on one side wall of the transfer chamber. By ventilating clean air from the cleaning unit into the transfer chamber, an air flow is formed inside the transfer chamber.

However, it is difficult to miniaturize the substrate processing apparatus according to the above-described conventional configuration of the transfer chamber.

SUMMARY

Described herein is a technique capable of downsizing a substrate processing apparatus.

According to one aspect of the technique described herein, there is provided a substrate processing apparatus including: a transfer chamber where a substrate is transferred into a substrate retainer; an upper gas supply mechanism configured to supply a gas into an upper region of the transfer chamber through a first gas supply port; and a lower gas supply mechanism disposed under the upper gas supply mechanism and configured to supply the gas into a lower region of the transfer chamber through a second gas supply port, wherein the upper gas supply mechanism includes: a first buffer chamber disposed at a back surface of the first gas supply port; a pair of upper ducts disposed at both sides of the first buffer chamber, and a first ventilation unit disposed at lower ends of the pair of upper ducts, and the lower gas supply mechanism includes: a second buffer chamber disposed at a back surface of the second gas supply port; a lower ducts disposed at lower surface of the second buffer chamber; and a second ventilation unit disposed at a lower end of the lower duct.

BRIEF DESCRIPTION OF THE DRAWINGS

FIG. 4A is a diagram illustrating a gas supply mechanism of the transfer chamber of the substrate processing apparatus according to the first embodiment described herein, and FIG. 4B is a diagram illustrating a side surface of the gas supply mechanism.

FIG. 8A is a diagram illustrating the gas flow in a first cleaning unit, and FIG. 8B is a diagram illustrating the gas flow in a second cleaning unit.

DETAILED DESCRIPTION

<First Embodiment>

Hereinafter, a first embodiment will be described with reference to FIGS. 1 and 2.

(1) Configuration of Substrate Processing Apparatus

Figure 1:
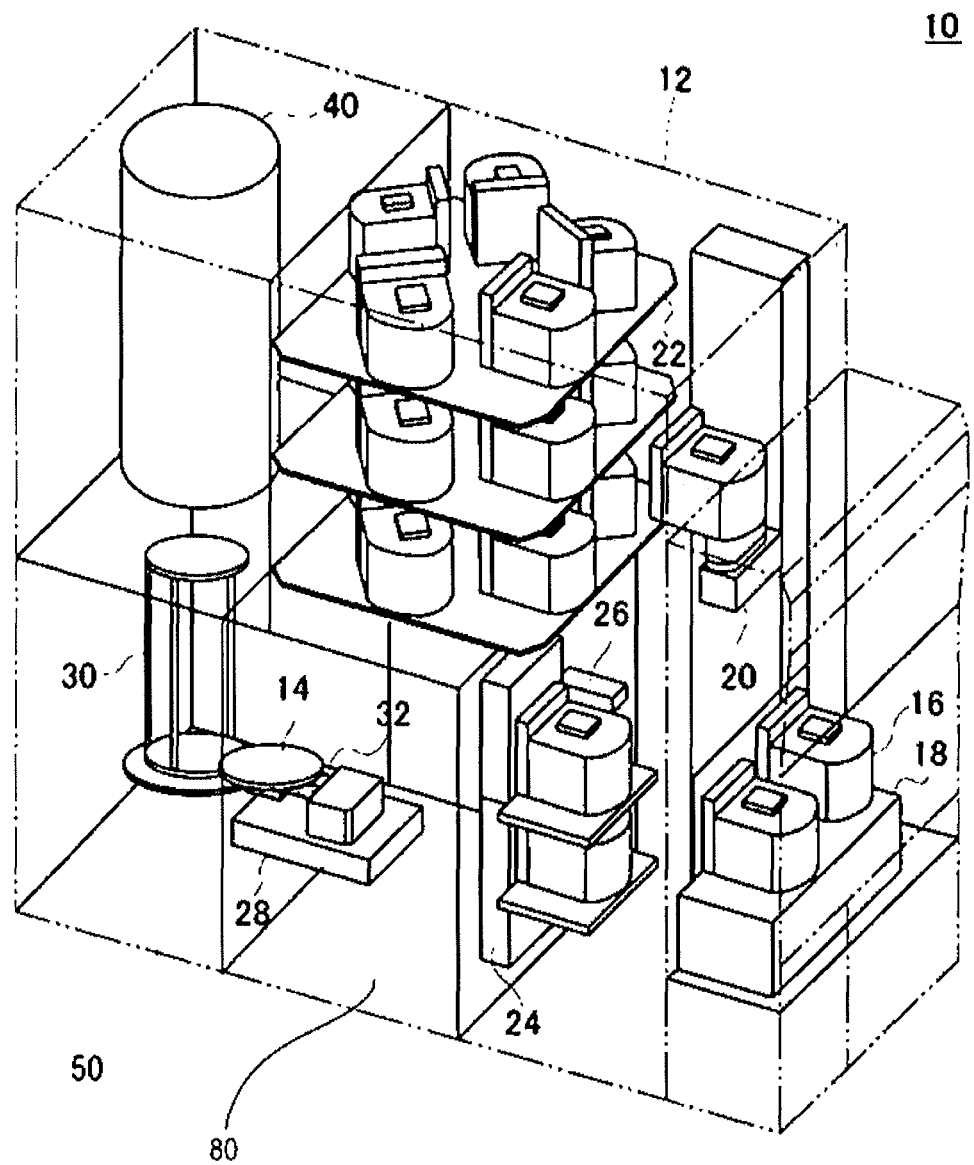
FIG. 1 is a schematic diagram illustrating a perspective view of a substrate processing apparatus according to a first embodiment described herein.

As shown in FIG. 1, a substrate processing apparatus 10 includes a housing 12 in which a processing furnace 40 is disposed. A pod stage 18 is disposed on the front side of the housing 12. A front opening unified pod (FOUP) 16 (pod), which is a substrate accommodating mechanism for accommodating a wafer (substrate) 14, is loaded on and unloaded from the pod stage 18 by an external transfer device (not shown).

A pod transfer device 20, a pod shelf 22 and a pod opener 24 are disposed at positions facing the pod stage 18 on the front side in the housing 12. The pod transfer device 20 is configured to transport the pod 16 among the pod stage 18, the pod shelf 22 and the pod opener 24. The pod shelf 22 is provided with shelf plates in multiple stages to support a plurality of pods 16.

A substrate transfer chamber 80 and a transfer chamber 50 are disposed so as to be closer to the rear side of the inside of the housing 12 than the pod opener 24. The detailed configuration of the transfer chamber 50 will be described later.

A substrate transfer device 28, which is a substrate transfer mechanism, is disposed in the substrate transfer chamber 80. A boat 30 serving as a substrate retainer is disposed in the transfer chamber 50. The substrate transfer device 28 has an arm 32 (tweezer) that can carry out the wafer 14. The substrate transfer device 28 transfers the wafer 14 between the pod 16 mounted on the pod opener 24 and the boat 30 by rotating and moving up and down the arm 32. The boat 30 supports a plurality of (for example, about 25 to about 150) wafers 14 in a horizontal manner in multiple stages. A heat insulating unit 75 is provided under the boat 30. The heat insulating unit 75 is made of a heat resistant material having a heat insulating effect such as quartz and silicon carbide (SiC). The heat insulating unit 75 includes, for example, a heat insulating plate 74. The heat insulating unit 75 may include a heat insulating cylinder (not shown), which is a cylindrical member, instead of the heat insulating plate 74. The boat 30 and the heat insulating unit 75 are moved up and down by a boat elevator 34 which is a lift mechanism.

The processing furnace 40 is disposed on the upper portion of the back side of the housing 12, that is, above the transfer chamber 50. The boat 30 is loaded into the processing furnace 40 from below the processing furnace 40.

A wafer loading/unloading port 51 is installed on the ceiling of the transfer chamber 50 and communicates with a process chamber 42. The wafer loading/unloading port 51 has a shape and a size facilitating the boat 30 to pass.

<Processing Furnace>

Figure 2:
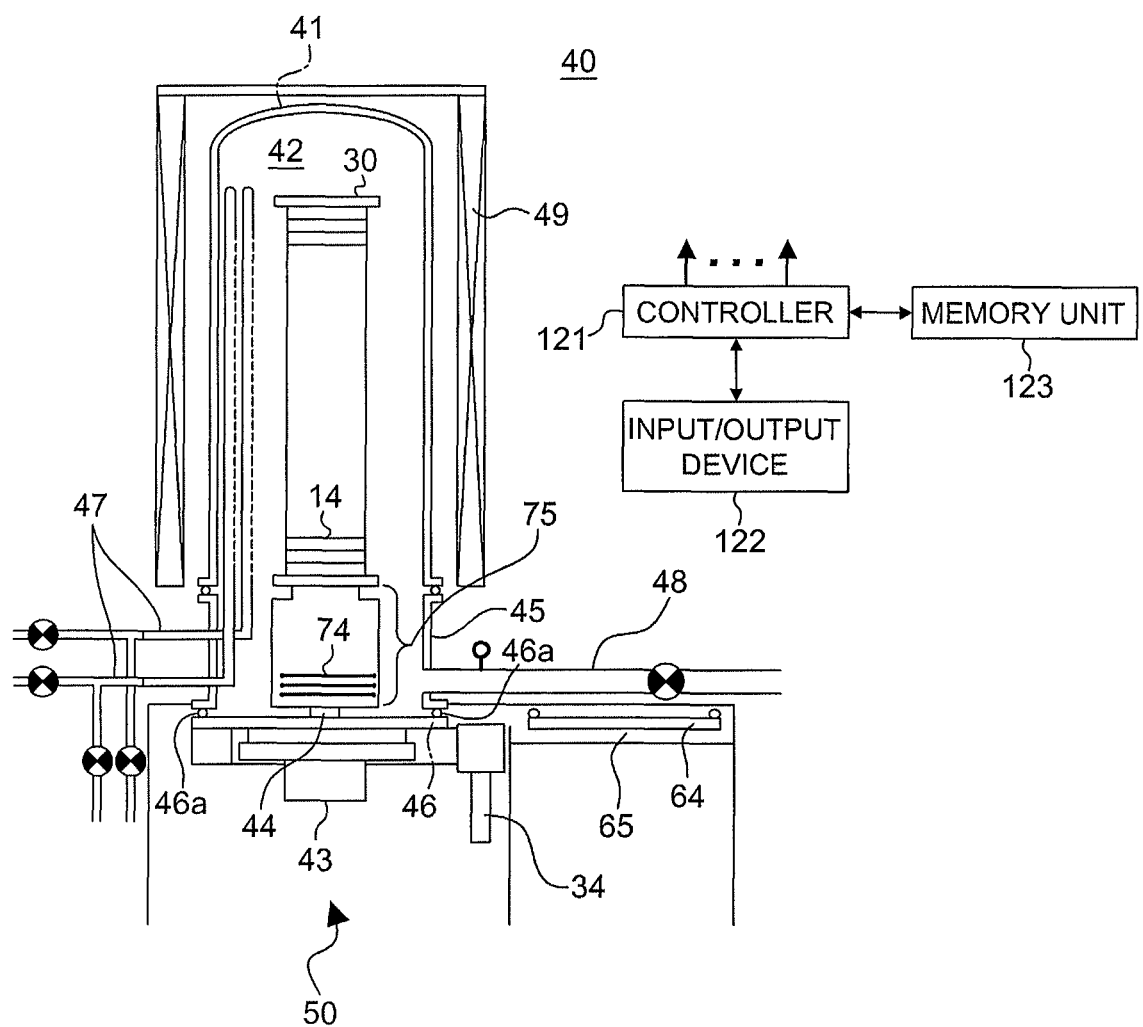
FIG. 2 is a vertical cross-sectional view of a processing furnace used in the substrate processing apparatus according to the first embodiment described herein.

As shown in FIG. 2, the processing furnace 40 includes a substantially cylindrical reaction tube 41. The reaction tube 41 is made of a non-metallic material resistant to heat such as quartz ($SiO_2$) and silicon carbide (SiC). The reaction tube 41 has a closed upper end and an open lower end.

The process chamber 42 is disposed inside the reaction tube 41. The boat 30 accommodated in the process chamber 42 is rotated with the plurality of wafers 14 loaded therein by rotating a rotary shaft 44 by a rotating mechanism 43.

The reaction tube 41 and a manifold 45 under the reaction tube 41 are concentrically arranged. The manifold 45 is made of a metallic material such as stainless steel and is cylindrical. The manifold 45 supports the lower end of the reaction tube 41 vertically. The lower end of the manifold 45 may be hermetically sealed by a seal cap 46 or a shutter 64. A sealing member 46a such as an O-ring that hermetically seals the inside of the process chamber 42 is provided on the upper surface of the seal cap 46 and the shutter 64. A gas introduction pipe 47 for introducing a gas such as a process gas and a purge gas into the process chamber 42 and an exhaust pipe 48 for exhausting the gas in the process chamber 42 are connected to the manifold 45.

A mass flow rate controller (MFC) (not shown), which is a flow rate controller (flow rate control unit) for controlling the flow rate of the process gas, and a valve serving as an on/off valve are connected to the gas introduction pipe 47 from the upstream side to the downstream side of the gas introduction pipe 47. The nozzle is connected to the front end of the gas introduction pipe 47. The process gas is supplied into the process chamber 42 via the MFC, the valve and the nozzle.

The exhaust pipe 48 is connected to a vacuum pump which is an exhaust device through a pressure sensor (not shown) which is a pressure detector (pressure detecting unit) for detecting the inner pressure of the process chamber 42 and an APC (Automatic Pressure Controller) valve which is a pressure regulator.

The heater unit 49 serving as the heating means (heating mechanism) is disposed concentrically with the reaction tube 41 on the outer periphery of the reaction tube 41.

A temperature sensor (not shown), which is a temperature detector, is installed in the reaction tube 41. The inner temperature of the process chamber 42 is adjusted to a desired temperature distribution by adjusting the state of power supplied to the heater 49 based on the temperature information detected by the temperature sensor.

The controller 121 is connected to and controls the rotating mechanism 43, the boat elevator 34, the MFC, the valve, the APC valve and the gas supply mechanism. The controller 121 is embodied by a microprocessor (computer) having a CPU, for example, and is configured to control the operation of the substrate processing apparatus 10. For example, an input/output device 122 such as a touch panel is connected to the controller 121.

A memory unit 123, which is a storage medium, is connected to the controller 121. A control program for controlling the operation of the substrate processing apparatus 10 or a program (also referred to as a recipe) for each component of the substrate processing apparatus 10 to perform the processing of the substrate according to processing conditions is readably stored in the memory unit 123.

The memory unit 123 may include a storage device (a hard disk or a flash memory) built in the controller 121 and may also include a portable external storage device (magnetic tape, magnetic disks such as flexible disk and hard disks, optical disks such as CD and DVD, magneto-optical disks such as MO, and semiconductor memory such as USB memories and memory cards). The program may be provided to the computer using a communication means such as the Internet and a dedicated line. The program can be read from the memory unit 123 by an instruction such as an instruction from the input/output device 122 when necessary. By performing processes according to the read recipe by the controller 121, each component of the substrate processing apparatus 10 executes desired processing under the control of the controller 121.

(2) Substrate Processing Step

Next, a process (film forming process) for forming a film on a substrate, which is one of semiconductor device manufacturing processes, using the substrate processing apparatus 10 according to the first embodiment will be described. According to the first embodiment, a silicon oxide ($SiO_2$) film is formed on the wafer 14 by supplying DCS ($SiH_2Cl_2$: dichlorosilane) gas as a source gas and $O_2$ (oxygen) gas as a reactive gas to the wafer 14. Hereinafter, the controller 121 controls the components that constitute the substrate processing apparatus 10.

The substrate transfer device 28 unloads the wafer 14 from the pod 16 and transfers the wafer to the boat 30 (wafer charging). At this time, a gas supply mechanism described later supplies a gas into the transfer chamber 50.

<Loading Step>

Thereafter, the shutter 64 for closing the wafer loading/unloading port 51 at the lower portion of the process chamber 42 is retreated to the receiving portion 65 for accommodating the shutter 64 to open the wafer loading/unloading port 51. Subsequently, the boat 30 is lifted from the transfer chamber 50 by the boat elevator into the process chamber 42 (boat loading). The seal cap 46 seals the lower end of the manifold 45 via the sealing member 46a.

<Processing Step>

The inside atmosphere of the process chamber 42 is exhausted through the exhaust pipe 48 and the inner pressure of the process chamber 42 is adjusted to a desired pressure (degree of vacuum). The boat 30 is rotated by the rotating mechanism 43 while the inside of the process chamber 42 is heated by the heater unit 49. The DCS gas and the $O_2$ gas are supplied into the process chamber 42 through the gas introduction pipe 47. A $Si_2$ film is then formed on the surface of the wafer 14 (film forming process).

After the film forming process is performed, an inert gas is supplied into the process chamber 42 so that the internal atmosphere of the process chamber 42 is replaced with the inert gas and the inner pressure of the process chamber 42 is returned to atmospheric pressure.

<Unloading Step>

The seal cap 46 is lowered by the boat elevator 34 and the lower end of the manifold 45 is opened. The boat 30 is then unloaded from the process chamber 42 through the lower end of the manifold 45 (Boat Unloading). Thereafter, the shutter 64 closes the wafer loading/unloading port 51 of the process chamber 42. The gas supply mechanism supplies a gas into the transfer chamber 50 and the boat 30 is in standby at a predetermined location in the transfer chamber 50 until the wafer 14 supported by the boat 30 is cooled.

<Transfer Step>

When the wafer 14 in the boat 30 in standby is cooled to a predetermined temperature (for example, about room temperature), the wafer 14 is unloaded from the boat 30 by the substrate transfer device 28 and transferred to the pod 16 (Wafer discharging). At this time, the gas supply mechanism continuously supplies the gas into the transfer chamber 50.

As described above, a series of substrate processing operations of the substrate processing apparatus 10 according to the first embodiment is completed.

(3) Configuration of the Transfer Chamber

Next, the configuration of the transfer chamber 50 according to the first embodiment will be described with reference to FIGS. 3 through 6.

<Transfer Chamber>

Figure 3:
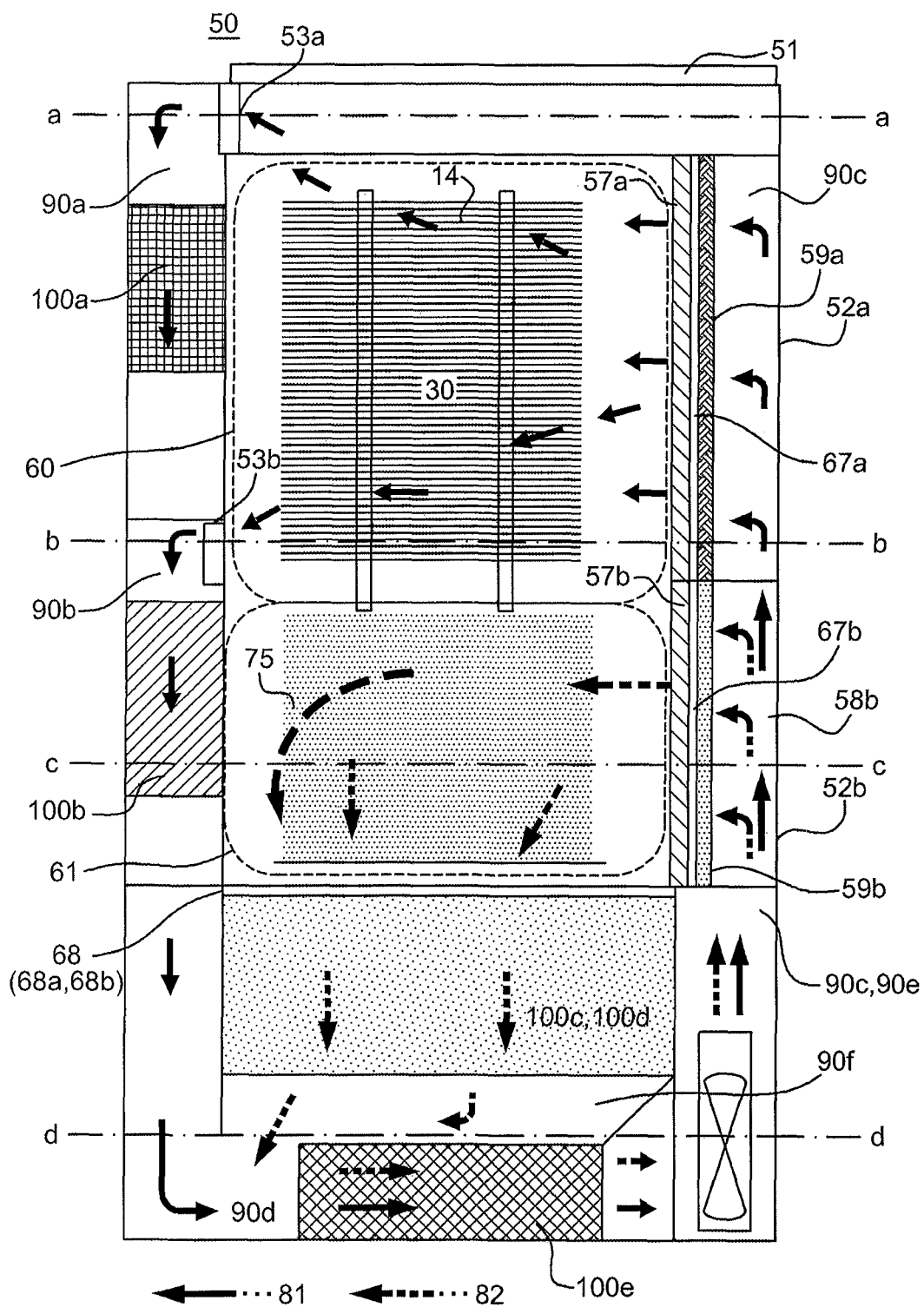
FIG. 3 is a diagram exemplifying a vertical cross-section of a transfer chamber of the substrate processing apparatus and a gas flow in the transfer chamber of the substrate processing apparatus according to the first embodiment described herein.

As shown in FIG. 3, the transfer chamber 50 has a rectangular shape defined by a ceiling, a floor and side walls. However, the shape of the transfer chamber 50 is not limited to the rectangular shape but may be polygonal (e.g., triangular, pentagonal and the like). The components such as a load lock chamber and a nitrogen purge box may not be installed in the transfer chamber 50. The inside of the transfer chamber 50 may be atmospheric.

A substrate region in the transfer chamber 50 where the wafer 14 (or the boat 30) is in standby is referred to as an upper region 60. A heat insulating region where the heat insulating unit 75 is located is referred to as a lower region 61.

<Gas Supply Mechanism>

The cleaning unit, which is a gas supply mechanism, is installed on one side (side wall) of the transfer chamber 50. The cleaning unit is divided into an upper cleaning unit 52a (upper gas supply mechanism) and a lower cleaning unit 52b (lower gas supply mechanism). The upper cleaning unit 52a and the lower cleaning unit 52b are arranged vertically adjacent to each other. A first circulation path 81 and a second circulation path 82, which will be described later, are formed in the transfer chamber 50.

The upper cleaning unit 52a is configured to supply gas to the upper region 60. The lower cleaning unit 52b is configured to supply gas to the lower region 61.

In the first embodiment, a gas such as an inert gas is used as a clean air. However, an external atmosphere may be used as the clean gas. Even when an external atmosphere is used, the external atmosphere may be filtered by filter units 59a and 59b, which are described later, to be used as a clean atmosphere (clean air). Hereinafter, the term "gas supply mechanism" may refer to one of the upper cleaning unit 52a and the lower cleaning unit 52b, or may refer to both of the upper cleaning unit 52a and the lower cleaning unit 52b.

<Upper Cleaning Unit>

As shown in 4A, the upper cleaning unit 52a includes, from the upstream side to the downstream side of the gas flow, a fan 56a (first fan) which is a ventilation unit for ventilating gas, a duct 90c (first duct) which forms a part of a gas path, a buffer area 58a (first buffer chamber) which is a diffusion space of the gas, the filter unit 59a and a gas supply port 67a. According to the first embodiment, as shown in FIG. 4B, a plurality of fans 56a, for example, two fans 56a are installed. The duct 90c is the gas path for guiding the gas ventilated by the fan 56a from the side of the buffer region 58a toward the inside of the buffer region 58a.

As illustrated in FIG. 4A, two ducts 90c are provided to correspond to the pair of fans 56a. The buffer region 58a communicates with the duct 90c and is a diffusion space for uniformly supplying the gas to the upper region 60. The filter unit 59a is configured to remove particles contained in the gas.

As shown in FIGS. 4A and 4B, the duct 90c extends to the upper end of the upper cleaning unit 52a in the vertical direction along both left and right sides of the buffer area 58a. The duct 90c is configured to supply gas from both sides of the buffer region 58a into the buffer region 58a. By supplying gas from both sides of the buffer region 58a as described above, it is possible to prevent a deviation in supply of gas in the buffer region 58a. The fan 56a is installed at the lower end of the upper cleaning unit 52a. The cross-section of the duct 90c gradually narrows until a predetermined location (the boundary between the buffer area 58a and the buffer area 58b) and has a constant width from the predetermined location toward the upper portion. The gas flow speeds up in the portion of the duct 90c with constant width (along the side of the buffer area 58a). Therefore, the gas may flow to the buffer area 58a (an upper end of the first duct 90c). As a result, a sufficient amount of gas can be supplied to the upper portion.

<Lower Cleaning Unit>

The lower cleaning unit 52b includes, from the upstream side to the downstream side of the gas flow, a fan 56b (second fan) which is a ventilation unit for ventilating gas, a duct 90e (second duct) which forms a part of a gas path for guiding the gas ventilated by the fan 56b to a buffer area 58b, the buffer area 58b (second buffer chamber) which communicates with the duct 90e and is a diffusion space of the gas in order to supply the gas uniformly, the filter unit 59b for removing particles contained in the gas and a gas supply port 67b for injecting the gas passed through the filter unit 50b into the lower portion 61. The duct 90e is a space formed under the buffer region 58b and is configured to supply gas from the lower surface of the buffer region 58b toward the inside of the buffer region 58b. The duct 90e has a funnel shaped vertical cross-section. The cross-section of the duct 90e gradually widens from the fan 56b toward the bottom surface (communication portion) of the second buffer chamber 58b. The fan 56b is installed adjacent to the lower end of the lower cleaning unit 52b between the two fans 56a of the upper cleaning unit 52a. That is, the two fans 56a of the upper cleaning unit 52a are installed on both sides of the fan 56b of the lower cleaning unit 52b.

Thus, the gas supply mechanism is vertically divided at the boundary between the upper region 60 and the lower region 61, and each divided structure has independent gas path. The first buffer chamber 58a is larger than the second buffer chamber 58b. Such configuration allows forming different gas flows in the upper region 60 and the lower region 61, or supplying the gas at different flow rates or flow rates. In the first embodiment, the filter units 59a and 59b are may include, for example, two layers of a chemical and PTFE.

<Exhaust Unit>

As shown in FIG. 3, a side exhaust unit is installed to face the upper cleaning unit 52a. The side exhaust unit includes an upper exhaust port 53a which is a first exhaust port and a lower exhaust port 53b which is a second exhaust port, which will be described later. The side exhaust unit may further include an exhaust duct 90a, a first radiator 100a, an exhaust duct 90b and a second radiator 100b. The gas supplied to the upper region 60 through the upper cleaning unit 52*a* cools and purges the inside of the upper region 60 and is exhausted through the exhaust units 53*a* and 53*b*.

The exhaust port 53*a* is provided at a portion of a side surface facing the upper cleaning unit 52*a* and the boat 30 interposed therebetween corresponding to the upper portion of the upper region 60. In the first embodiment, the boat elevator 34 extending vertically is installed at a side where the exhaust port 53*a* is installed. The gas exhausted through the first exhaust port 53*a* flows in the duct 90*a*. The duct 90*a* is narrowed starting from the second exhaust port 53*b*. The gas is cooled while passing through the radiator 100*a* in the duct 90*a* and flows through the duct 90*a* at one side of the second exhaust port 53*b* down to and the lower portion of the transfer chamber 50.

The exhaust port 53*b* is provided at a portion of a side surface facing the upper cleaning unit 52*a* and the boat 30 interposed therebetween corresponding to the lower portion of the upper region 60. The gas exhausted through the exhaust port 53*b* flows in the duct 90*b*. The gas is cooled while passing through the radiator 100*b* in the duct 90*b* and converged with the gas exhausted through the duct 90*a* in the lower portion of the transfer chamber 50. The converged gas is also converged with the exhaust gas from the lower region 61, which will be described later. By providing the two exhaust ports 53*a* and 53*b* in the upper region 60 as described above, the gas supplied to the upper region 60 can be promptly exhausted.

Figure 6:
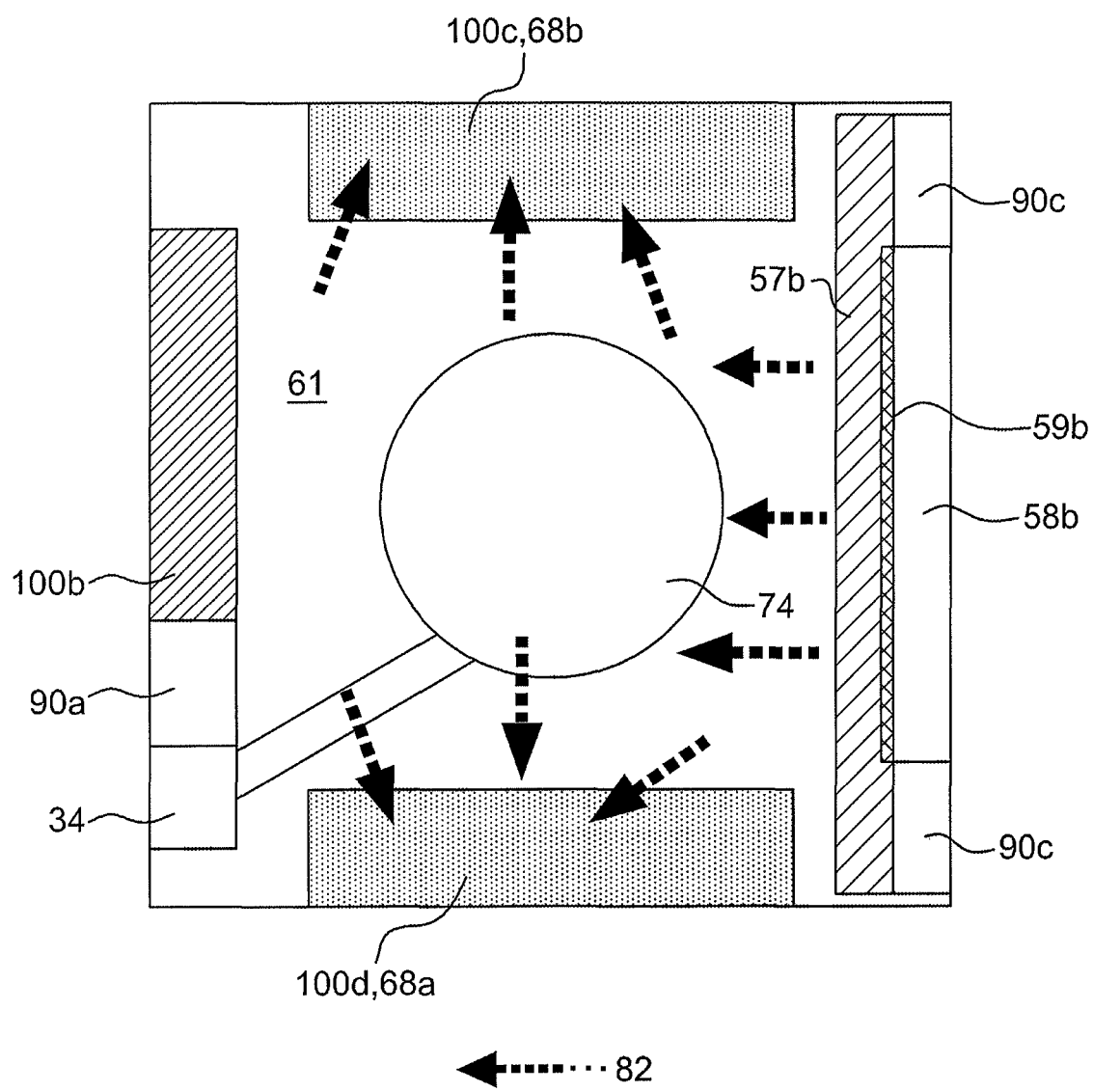
FIG. 6 is a diagram schematically illustrating a cross-section taken along the line c-c in FIG. 3.

Next, the exhaust in the lower region 61 will be described. As shown in FIGS. 3 and 6, a bottom exhaust unit 68 is provided below the front and rear portion of lower regions 61 about the boat 30 when viewed from above. The bottom exhaust unit 68 has a front exhaust port 68*a* (third exhaust) and a rear exhaust port 68*b* (fourth exhaust). The exhaust ports 68*a* and 68*b* are rectangular in shape along the corner portions of the bottom portion of the transfer chamber 50. The gas supplied to the lower region 61 through the lower cleaning unit 52*b* cools and purges the inside of the lower region 61 and is exhausted through the exhaust unit 68. The gas exhausted through the exhaust unit 68 is cooled by the third radiator 100*c* and the fourth radiator 100*d* provided under the front exhaust port 68*a* and the rear exhaust port 68*b* in the duct 90*f*, and flows through the duct 90*f* and is exhausted to the lower portion of the transfer chamber 50. The gas exhausted through the lower region 61 is converged with the exhaust gas passing through the ducts 90*a* and 90*b* of the upper region 60 at the lower portion of the transfer chamber 50. The converged gas is cooled again by the fifth radiator 100*e*. Next, the gas is ventilated back to the upper cleaning unit 52*a* and the lower cleaning unit 52*b* to be re-supplied to the upper region 60 and the lower region 61.

<Circulation Path>

The gas exhausted from the inside of the transfer chamber 50 is supplied back into the transfer chamber 50 via the first circulation path 81 indicated by the solid line arrow and the second circulation path 82 indicated by the broken line arrow. The first circulation path 81 is a gas path for supplying the gas exhausted from the upper region 60 through the exhaust port 53*a* and the exhaust port 53*b* back into the upper region 60 via the upper cleaning unit 52*a*. The second circulation path 82 is a gas path for supplying the gas exhausted from the lower region 61 through the front exhaust port 68*a* and the rear exhaust port 68*b* back into the lower region 61 through the lower cleaning unit 52*b*. Hereinafter, the term circulation path may refer to one of the first circulation path 81 and the second circulation path 82 or may refer to both of the first circulation path 81 and the second circulation path 82.

The first circulation path 81 is constituted by ducts 90*a*, 90*b*, 90*c* and 90*d*. The duct 90*a* is a path communicating the exhaust port 53*a* and the duct 90*d*. The radiator 100*a* is installed inside the duct 90*a*. The duct 90*b* is a path communicating the exhaust port 53*b* and the duct 90*d*. The radiator 100*b* is installed in the duct 90*b*. The first circulation path 81 may further include an upper cleaning unit 52*a* and the side exhaust unit.

The second circulation path 82 is constituted by ducts 90*f* and 90*e*. The duct 90*f* is a path communicating with the exhaust ports 68*a* and 68*b* and the duct 90*d*. The radiators 100*c* and 100*d* are installed in the duct 90*f*. The duct 90*d* is a space at the lower portion of the transfer chamber 50. The second circulation path 82 may further include a lower cleaning unit 52*b* and the bottom exhaust unit 68.

The first circulation path 81 and the second circulation path 82 partially converges in the duct 90*d*. That is, the first circulation path 81 and the second circulation path 82 partially share a common path (confluence path). That is, the duct 90*d* communicates with the duct 90*a* and the duct 90*b* and also communicates with the cleaning unit 52*a* and the cleaning unit 52*b*. In a portion other than the duct 90*d*, the second circulation path 82 is a gas path independent of the first circulation path 81. The total length of the path along the second circulation path 82 is shorter than the total length of the path along the first circulation path 81.

As shown in FIG. 3, a radiator 100*e*, which is a cooling unit for cooling the gas, is disposed in the duct 90*d*. The two fans 56*a* and 56*b* are provided at the communicating unit of the cleaning units 52*a* and 52*b*, i.e. at the lower ends of the cleaning units 52*a* and 52*b* which are also the end portion of the duct 90*d*. By adjusting the outputs of the fans 56*a* and 56*b*, the flow rate or the flow velocity of the gas supplied to each cleaning unit can be adjusted.

A gas damper (not shown) may be installed in the first circulation path 81 and the second circulation path 82. The gas damper is configured to adjust the flow rate of gas flowing through the first circulation path 81 and the second circulation path 82. For example, the gas damper may be embodied using known flow control mechanisms such as butterfly valves and needle mechanisms. The gas damper is capable of automatically controlling the flow rate, and is preferably configured to perform the interlocking control with the fans 56*a* and 56*b*.

<Comparative Example>

Figure 11:
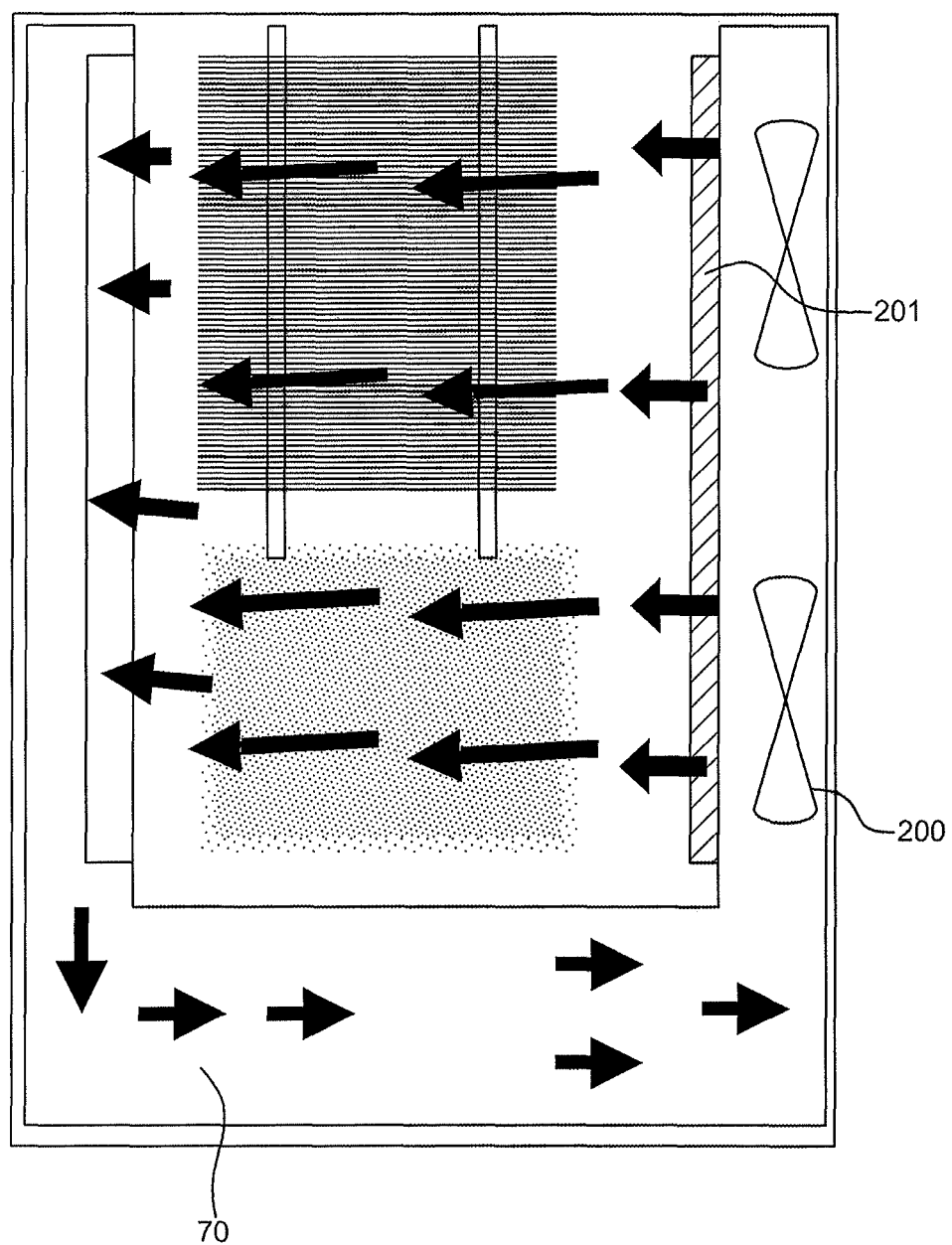
FIG. 11 is a diagram showing a conventional configuration.

Here, the configuration of a conventional transfer chamber, which is a comparative example, will be described with reference to FIG. 11.

According to the configuration of the conventional cleaning unit, the fan 200 is installed on the back surface of the filter 201. According to the configuration of the conventional transfer chamber, the cleaning unit is disposed on one side of the transfer chamber, and a circulation path is disposed on the lower portion of the transfer chamber. According to this configuration, a large area for disposing the cleaning unit is required at one side in the transfer chamber. Therefore, it is difficult to miniaturize the substrate processing apparatus. Since the inhaling direction of the fan is directed toward the wall, the pressure loss is increased. Therefore, deterioration of the performance of the cleaning unit may occur.

In contrast, the cleaning unit according to the first embodiment described herein has the filter disposed at the upper portion thereof and the fan disposed at the lower portion thereof. Therefore, the cleaning unit may be disposed on the side surface of the transfer chamber since less space is required to dispose the cleaning unit compared to the conventional example. In the cleaning unit according to the first embodiment described herein, since the inhaling direction and the exhaling direction of the fan are orthogonal to each other, the pressure loss can be suppressed and the performance of the cleaning unit can be improved.

<Gas Flow>

Next, the gas flow in accordance with the first embodiment will be described in detail with reference to FIG. 3. The solid line arrows in FIG. 3 represent the gas flow in the upper region 60, and the dashed line arrows represent the gas flow in the lower region 61.

First, the gas flow in the upper region 60, which is the first circulation path 81, will be described. The gas supplied to the upper region 60 through the gas supply port 67a of the cleaning unit 52a flows parallel to the substrate. The gas that has cooled the wafer 14 is exhausted through the exhaust ports 53a and 53b and flows downward in the ducts 90a and 90b. Next, the direction of the gas flow in the communicating portion between the ducts 90a and 90b and the duct 90d is changed from the downward direction to the horizontal direction such that the gas flows into the duct 90d toward the fan 56a of the cleaning unit 52a in the horizontal direction. Thereafter, the gas is ventilated upward by the fan 56a and flows vertically upward in the two ducts 90c. Thereafter, the gas is diffused from both sides of the buffer region 58a into the buffer region 58a, and then supplied back into the upper region 60.

Next, the gas flow in the lower region 61 which is the second circulation path 82 will be described. The gas supplied to the lower region 61 through the cleaning unit 52b flows downward in the space between the heat insulating unit 75 and the side surface of the transfer chamber 50. The gas that has cooled the heat insulating unit 75 is exhausted downward through the exhaust ports 68a and 68b and flows downward in the duct 90f to converge with the gas flowing along the first circulation path 81. Thereafter, the gas is ventilated upward by the fan 56b and flows vertically upward in the duct 90e. Thereafter, the gas is diffused into the buffer region 58b through the duct 90e and the lower surface of the buffer region 58b, and is supplied back into the lower region 61.

<Shutter Exhaust Unit>

Figure 5:
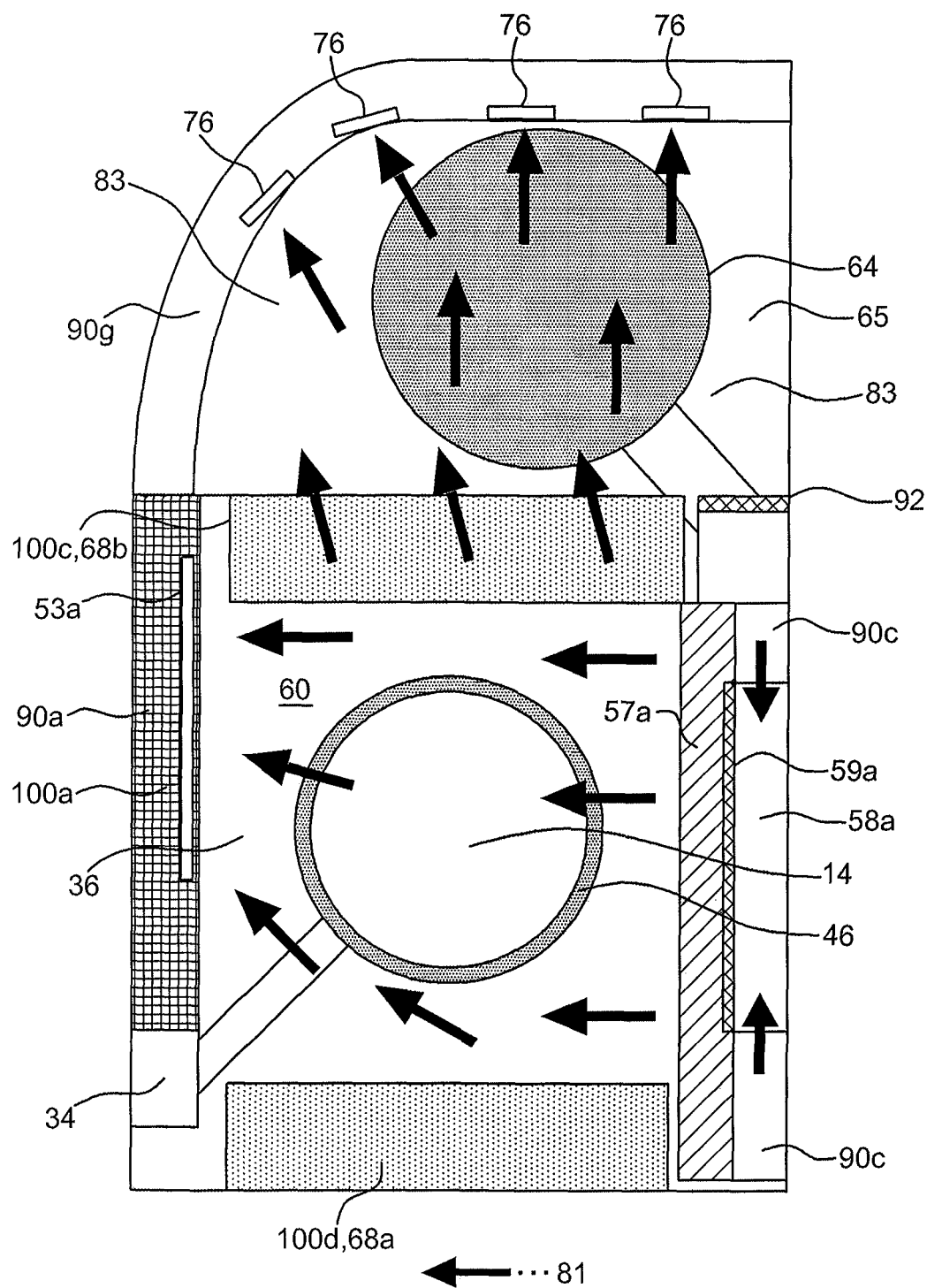
FIG. 5 is a diagram schematically illustrating a cross-section taken along the line a-a in FIG. 3.

As shown in FIG. 5, an exhaust port 76 is provided on the side surface of the receiving portion 65, and the gas supplied into the receiving portion 65 is exhausted through the exhaust port 76. A third circulation path 83 for the receiving portion 65 is thereby formed. The third circulation path 83 is configured to exhaust the gas supplied in the vicinity of the wafer loading/unloading port 51 and the receiving portion 65 through the exhaust port 76. A gas flow passing through the region above the upper region 60 is formed by the third circulation path 83. As shown in FIG. 5, the third circulation path 83 is indicated by a portion of the solid line arrows which is the path of the first circulation path 81. That is, the third circulation path 83 is formed by branching from the first circulation path 81.

By inhaling the gas supplied into the upper region 60 through the exhaust port 76, the periphery of the wafer loading/unloading port 51 and the inside of the receiving portion 65 are purged. The receiving portion 65 protrudes from the transfer chamber 50 at the upper end of the side surface of thereof. According to the first embodiment, the receiving portion 65 is polygonal (for example, rectangular) with one of the angles of a polygon curved when viewed from above. A straight portion and a curved portion are provided at one side of the receiving portion 65. A plurality of exhaust ports 76 are provided along the straight portion and the curved portion. The exhaust ports 76 are provided in the same number in the straight portion and the curved portion, for example, two in each. The exhaust port 76 of the curved portion is deflected toward the straight portion. That is, the exhaust port 76 of the curved portion is disposed closer to the straight portion and spaced apart from the exhaust port 53a.

The circulation path 83 for cyclically exhausting the receiving portion 65 is constituted by ducts 90a, 90c and 90g. The duct 90g communicates with the duct 90a and is a space provided on the back surface of the exhaust port 76. The downstream side of the duct 90a of the circulation path 83 is shared with the first circulation path 81.

It is preferable that the volume of air generated by the upper cleaning unit 52a and the lower cleaning unit 52b and the total volume of air of the gas passing through the exhaust ports 53a and 53b and the radiators 100c and 100e are balanced. However, since the temperature of the wafer is also changed in accordance with the processing in the process chamber 42, the volume of air can be appropriately determined.

<Effects of the First Embodiment>

According to the first embodiment, there is one or more of the effects described below.

(a) By installing the ventilation unit below the filter rather than behind the filter (i.e., the lower end portion of the gas supply mechanism), the size of the housing of the gas supply mechanism may be reduced. Therefore, the footprint of the entire substrate processing apparatus may be reduced. (b) By arranging the ventilation unit at the lower end of the cleaning unit, the exhaling direction of the ventilation unit can be directed toward the inside of the transfer chamber. Therefore, the pressure loss of the gas flow in the circulation path or the stagnation of the gas flow can be reduced. Further, since the ventilation unit can be isolated from the heat from transfer chamber, the service life of the ventilation unit can be extended. The maintenance of the ventilation unit and the filter may be performed through the front side of the cleaning unit. As a result, the maintenance may be facilitated, the time required for maintenance can be reduced and the productivity can be improved. (c) By installing the radiator in the vicinity of the exhaust port of each circulation path, the gas heated in the transfer chamber can be promptly cooled. Therefore, the flow of the gas in the circulation path can be smoothly formed, and the stagnation of the gas can be suppressed. (d) Since the gas passes through the two radiators in any circulation path, the heated gas can sufficiently be cooled in the transfer chamber. The difference in gas temperature by the circulation path can be thereby minimized. Further, the temperature deviation of the gas during the re-supply of the gas into the transfer chamber may be suppressed, and the inside of the transfer chamber can be uniformly cooled. (e) The upper region can be efficiently purged by disposing the upper and lower exhaust units in the upper and lower portions thereof. By cooling the substrate using the exhaust unit provided in the upper portion of the upper region, the hot air of the ascending air current generated by the heated gas or the particles in the opening portion of the furnace can be promptly exhausted. The heated gas or the particles in the driving portion of the boat elevator may be promptly exhausted by cooling the substrate using the exhaust unit provided in the lower portion of the upper region. (f) By providing the exhaust unit in the lower region at two locations in front and rear, the atmosphere in the lower region which is higher in temperature than the upper region can be forcibly exhausted downward. Therefore, the generation of the upward flow in the lower region may be suppressed. Further, the heat from the heat insulating unit having a high heat capacity can be prevented from being conducted into the substrate region such that the time required for cooling the substrate may be reduced. By suppressing the particles from moving upward due to the upward flow of the heat, the adhesion of the particles to the substrate can also be suppressed. Further, by providing the rectangular exhaust unit along the corner portions of the lower portion where gas stagnation is likely to occur, the lower portion can be promptly exhausted. (g) By providing the exhaust unit in the upper region on the side facing the gas supply mechanism and installing the exhaust unit in the lower region at the bottom portion of the transfer chamber, a downflow can be formed in the lower region and a side flow in the upper region. (h) The length of the total path of the circulation path of the lower region is shorter than the length of the total path of the circulation path of the upper region. Therefore, the circulation cycle of the gas supplied to the lower region can be shortened to improve the cooling efficiency of the heat insulating unit. (i) A balanced flow can be formed by balancing the total volume of the exhausted air by exhaust units and the total volume of air by the gas supply mechanism. (j) By regulating the outputs of the fan of the upper cleaning unit and the fan of the lower cleaning unit, the flow rate of the gas supplied by each gas supply mechanism can be adjusted.

<Second Embodiment>

Next, the second embodiment will be described hereinafter.

Figure 7:
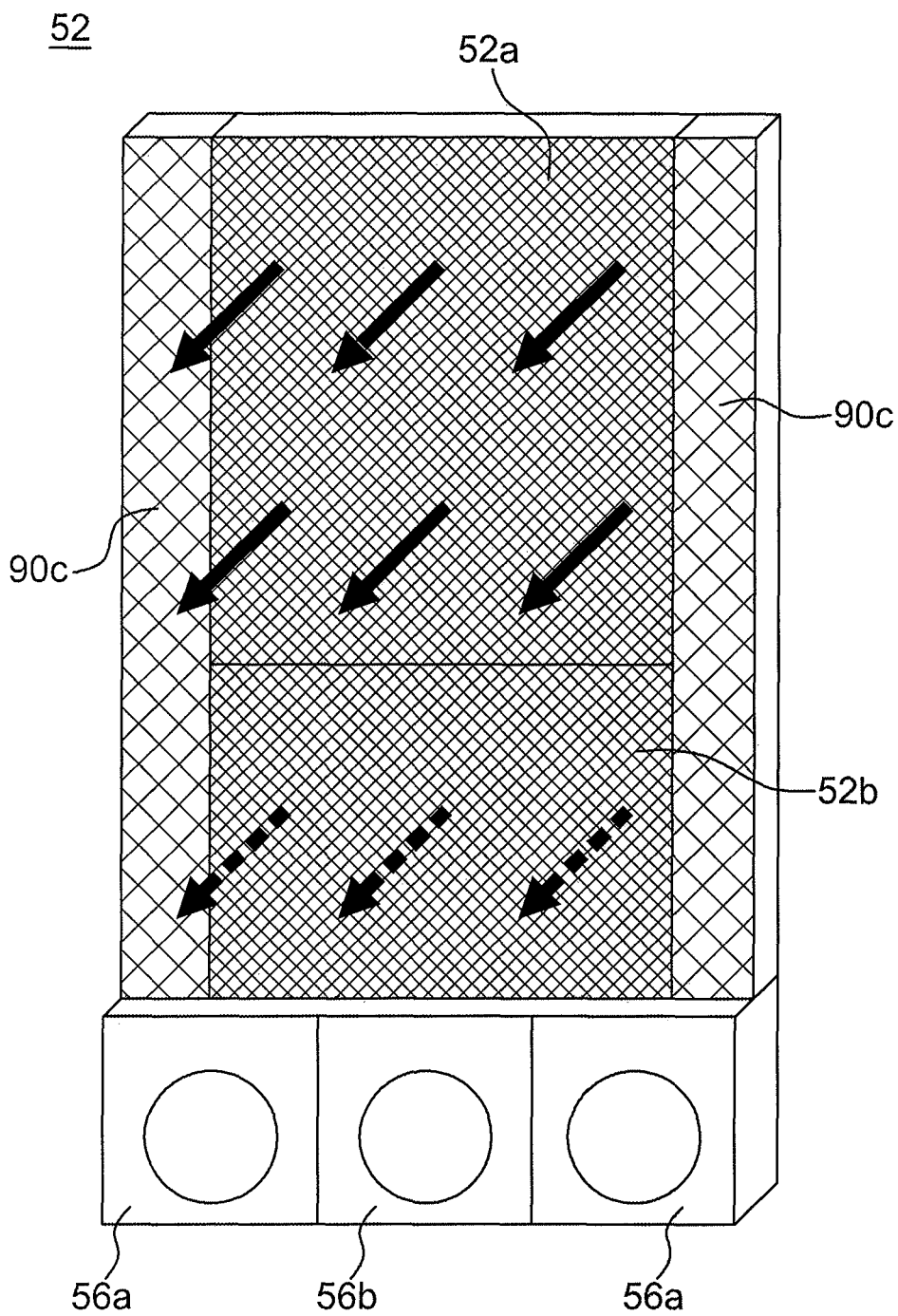
FIG. 7 is a perspective view of a cleaning unit according to the first embodiment described herein.
Figure 9:
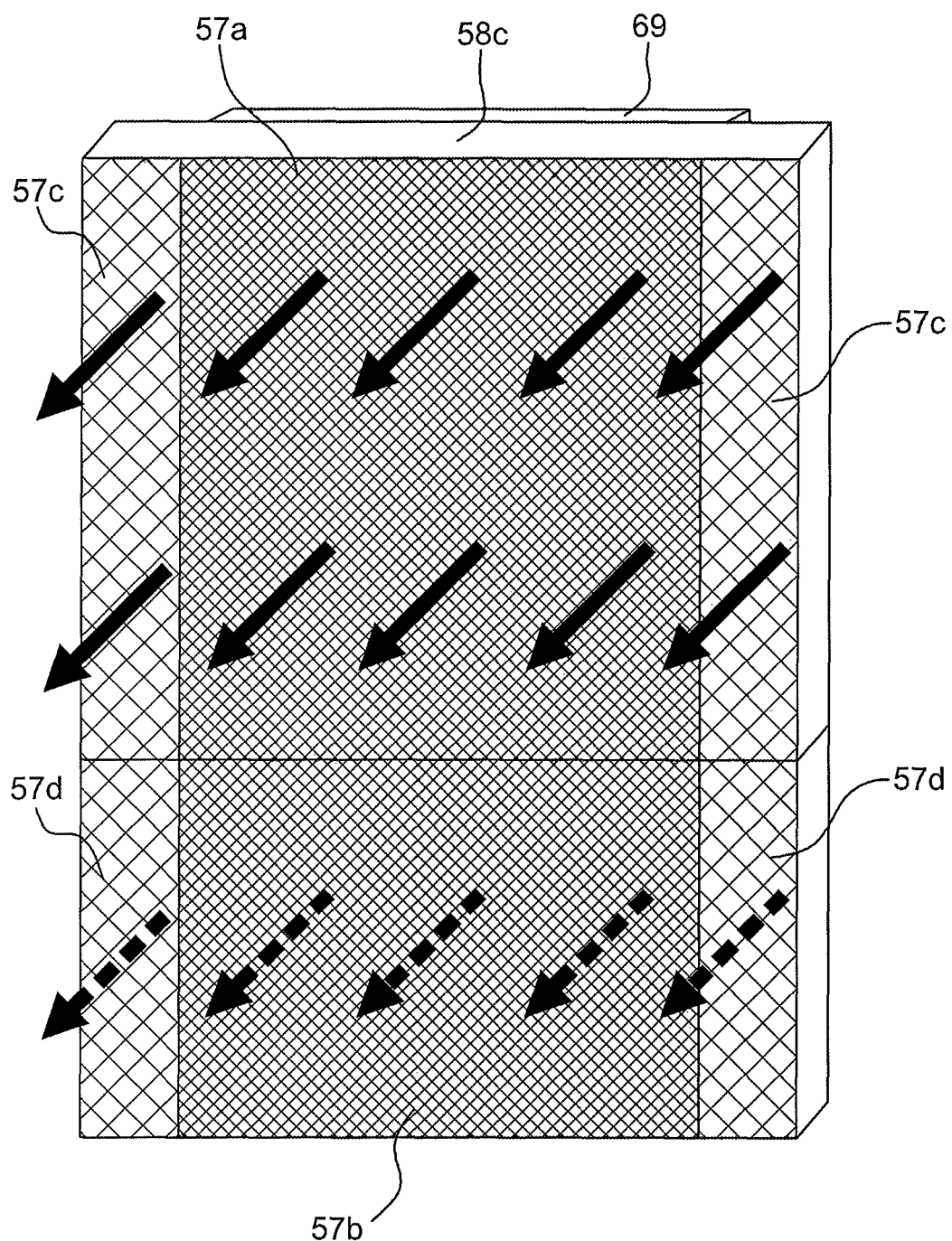
FIG. 9 is a diagram illustrating a gas dispersion unit according to a second embodiment described herein.
Figure 10:
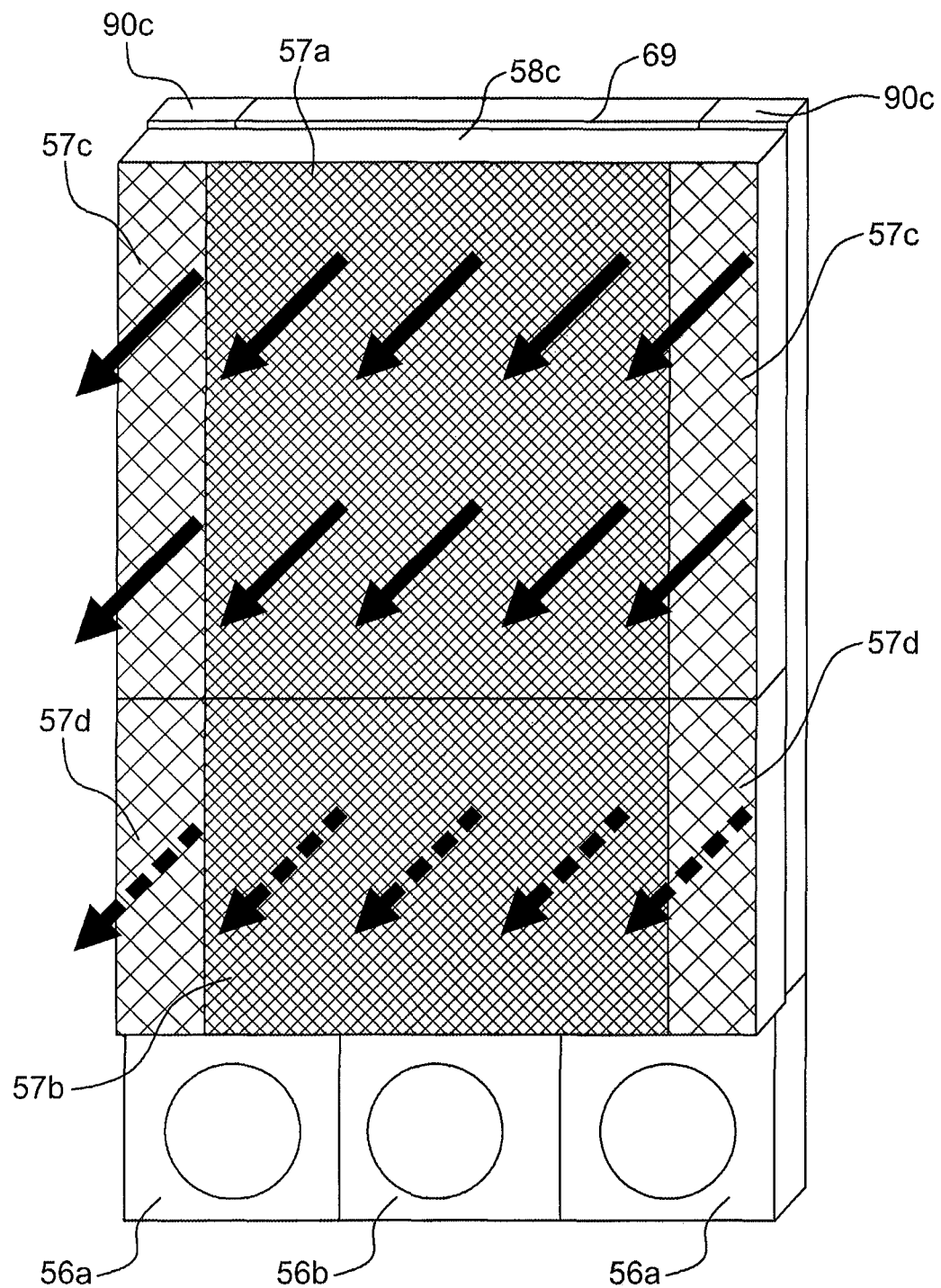
FIG. 10 is a view exemplarily showing a configuration in which the gas dispersion unit is provided to a cleaning unit according to the second embodiment described herein.

As shown in FIGS. 9 and 10, according to the second embodiment described herein, the gas dispersion unit 57 is installed in front of the cleaning unit 52. According to the configuration of the second embodiment described herein, the range of the gas supplied may be broadened as compared to the configuration of the first embodiment shown in FIGS. 7, 8A, and 8B. The gas dispersion unit 57 has a buffer region 58c as a third buffer region provided therein, a communicating unit 69 communicating with the cleaning unit 52, center panels 57a and 57b and side panels 57c and 57d having gas supply ports. The center panel 57a has a height substantially equal to the gas supply port 67a of the upper cleaning unit 52a and has a width substantially the same as the transfer chamber 50. The side panels 57c are provided at both sides of the center panel 57a. In accordance with the embodiment shown in FIG. 9, the width of the center panel 57a is substantially equal to the gas supply port 67a, and the width of the side panels 57c is substantially equal to the duct 90c. A plurality of gas supply ports are disposed in each of the center panel 57a and the side panels 57c. Each of the center panel 57a and the side panels 57c may include a punched panel. The center panel 57b and the side panels 57d may be configured similar to the center panel 57a and the side panel 57c, respectively. The gas supplied through the cleaning unit is diffused in the buffer region 58c and then supplied into the transfer chamber 50 through the plurality of ports.

The gas is directly supplied from the gas supply port of the cleaning unit 52 toward the center panel 57a. Therefore, by adjusting the opening ratio of the center panel 57a, the amount of gas supplied through the center panel 57a may be smaller than the amount of gas supplied through the gas supply port of the cleaning unit 52. As a result, the diffusion of the gas into the buffer region 58c may be facilitated. More specifically, by making the opening ratios of the plurality of gas supply ports of the center panel 57a different from the opening ratio of the plurality of gas supply ports of the side panels 57c, i.e. by making the opening ratio of the side panels 57c greater than the opening ratio of the center panel 57a, the diffusion of the gas through the side panel 57c can be promoted. The volume of air through the gas dispersion unit 57 may be maintained at uniform level throughout the entire surface of the gas dispersion unit 57.

As described above, the second embodiment in which the gas dispersion unit 57 is provided at the front side of both the upper cleaning unit 52a and the lower cleaning unit 52b. However, according to the second embodiment, the gas dispersion unit 57 may be installed only at one of the upper cleaning unit 52a and the lower cleaning unit 52b. The gas dispersion unit 57 may have a larger surface area (preferably the same width as the wafer 14, more preferably substantially the same width as the transfer chamber 50) than the filter surface of the cleaning unit 52. The opening ratio of the panel of the gas dispersion unit provided in the upper cleaning unit 52a may be different from the opening ratio of the panel of the gas dispersion unit provided in the lower cleaning unit. The width of the panel of the gas dispersion unit 57 provided in the upper cleaning unit 52a may be different from the width of the panel 57 provided in the lower cleaning unit 52b. The area of the center panel 57a of the gas dispersion unit 57 provided in the upper cleaning unit 52a may be smaller than the area of the center panel 57b of the gas dispersion unit 57 provided in the lower cleaning unit 52b.

<Effects of the Second Embodiment>

According to the second embodiment, there is one or more of the effects described below. (a) By installing the gas dispersion unit, the area (gas ejection area) of the gas supply port can be adjusted, and the gas can be uniformly supplied even to the corner of the transfer chamber. (b) By providing the buffer chamber in the gas dispersion unit, the gas can be diffused in the buffer chamber at once even when the area of the gas supply ports of the gas dispersion unit is larger than the area of the gas supply port of the gas supply mechanism. Therefore, the gas can be supplied through the entire surface of the gas supply hole of the gas dispersion unit. (c) By constituting the gas dispersion unit using a punched panel and changing the opening ratios of the portion facing the gas supply port of the gas supply mechanism and portions other than the portion facing the gas supply port, the flow rate (air flow rate) can be provided even in the expanded portion and the gas can be supplied from the entire front surface of the gas dispersion unit at the same flow rate (volume of air).

<Other Embodiments>

Next, another embodiment described herein will be described.

In addition to the embodiments described above, the techniques described herein may be embodied in various forms without departing from the spirit of the technique.

According to the technique described herein, the substrate processing apparatus can be miniaturized.

What is claimed is:

1. A substrate processing apparatus comprising:
a transfer chamber where a substrate is transferred into a substrate retainer;
an upper gas supply mechanism configured to supply a gas into an upper region of the transfer chamber through a first gas supply port; and
a lower gas supply mechanism disposed under the upper gas supply mechanism and configured to supply the gas into a lower region of the transfer chamber through a second gas supply port,
wherein the upper gas supply mechanism comprises:
a first buffer chamber disposed at a back surface of the first gas supply port;

a pair of upper ducts disposed at both sides of the first buffer chamber; and a first ventilation unit disposed at lower ends of the pair of upper ducts, and the lower gas supply mechanism comprises:

a second buffer chamber disposed at a back surface of the second gas supply port;

a lower duct disposed at lower surface of the second buffer chamber; and a second ventilation unit disposed at a lower end of the lower duct.

2. The substrate processing apparatus of claim 1, wherein the first ventilation unit comprises two ventilation units disposed at the lower ends of the pair of upper ducts to correspond to the pair of upper ducts, and the second ventilation unit disposed between the two ventilation units.

3. The substrate processing apparatus of claim 2, wherein the first buffer chamber is larger than the second buffer chamber.

4. The substrate processing apparatus of claim 3, wherein the pair of upper ducts extends from an upper end of the first buffer chamber along both sides of the second buffer chamber to the lower end of the lower duct.

5. The substrate processing apparatus of claim 3, wherein the lower duct has funnel shape when viewed from front.

6. The substrate processing apparatus of claim 5, wherein a cross-section of the upper duct gradually narrows toward an upper direction.

7. The substrate processing apparatus of claim 1, further comprising a gas dispersion unit disposed at one of the first gas supply port and the second gas supply port or both of the first gas supply port and the second gas supply port.

8. The substrate processing apparatus of claim 7, wherein the gas dispersion unit comprises: a panel provided with third gas supply ports disposed on an entire surface thereof; and a third buffer chamber disposed behind the panel.

9. The substrate processing apparatus of claim 8, wherein the panel is larger than the first gas supply port.

10. The substrate processing apparatus of claim 9, wherein the panel comprises a punched member provided with the third gas supply ports, and an opening ratio of a center portion of the panel is different from an opening ratio of a side portion of the panel.

11. The substrate processing apparatus of claim 10, wherein the opening ratio of the center portion is greater than the opening ratio of the side portion.

12. The substrate processing apparatus of claim 11, wherein an area of the center portion is same as an area of the first gas supply port.

* * * * *